United States Patent
Yeh et al.

(10) Patent No.: US 11,456,711 B2
(45) Date of Patent: Sep. 27, 2022

(54) MEASUREMENT METHOD USING RADIO FREQUENCY POWER AMPLIFIER

(71) Applicant: Taiwan Semiconductor Manufacturing Company, Ltd., Hsinchu (TW)

(72) Inventors: En-Hsiang Yeh, Hsin-Chu (TW); Wen-Sheng Chen, Taipei (TW); Chia-Ming Liang, Hsinchu (TW); Chung-Ho Chai, HsinChu (TW); Zong-You Li, Hsinchu (TW); Tzu-Jin Yeh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 59 days.

(21) Appl. No.: 17/006,892

(22) Filed: Aug. 31, 2020

(65) Prior Publication Data

US 2022/0069779 A1 Mar. 3, 2022

(51) Int. Cl.
*H03F 1/22* (2006.01)
*H03F 3/195* (2006.01)
*H03F 3/24* (2006.01)

(52) U.S. Cl.
CPC ............. *H03F 3/195* (2013.01); *H03F 3/245* (2013.01); *H03F 2200/451* (2013.01)

(58) Field of Classification Search
CPC .......................................................... H03F 1/22
USPC .................................................. 330/311, 310
See application file for complete search history.

(56) References Cited

U.S. PATENT DOCUMENTS

| | | | | |
|---|---|---|---|---|
| 7,956,682 B2 * | 6/2011 | Hasegawa | ............... | H03F 1/223 330/311 |
| 8,482,348 B2 * | 7/2013 | Pinarello | ............... | H03F 1/0211 330/311 |

* cited by examiner

*Primary Examiner* — Henry Choe
(74) *Attorney, Agent, or Firm* — JCIPRNET

(57) ABSTRACT

The measurement method includes operations of applying a first gate bias voltage to a gate terminal of a first transistor that is included in a radio frequency (RF) power amplifier during a direct current (DC) measurement period, wherein the first transistor operates in a linear operation mode during the DC measurement period; measuring a first drain-source voltage of the first transistor and a current flowing through the first transistor via a connection node during the DC measurement period; applying a second gate bias voltage and a drain bias voltage to a gate terminal and a drain terminal of a second transistor that is electrically connected to the first transistor via the connection node; and measuring a DC value of the second transistor via the connection node during the DC measurement period.

8 Claims, 5 Drawing Sheets

MEASUREMENT METHOD USING RADIO FREQUENCY POWER AMPLIFIER

BACKGROUND

Electronic circuits in applications such as automotive systems are usually operated in high voltage and long-hour radio frequency (RF) stringent stress conditions. As the electronic circuits are desired have a certain level of reliability and durability, measurements are performed to evaluate performance of the electronic circuits.

Probes such as direct-current (DC) probes and RF probes may be used to measure DC performance and RF performance of the electronic circuits, respectively. However, the probes are expensive and may wear out due to frequent usage. In addition, it is time-consuming to change the DC probes and RF probes frequently, especially for the electronic circuits that requires both of the DC measurements and RF measurements.

As such, a creative technique and design for improving an effectiveness and performance of the DC measurements and RF measurements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
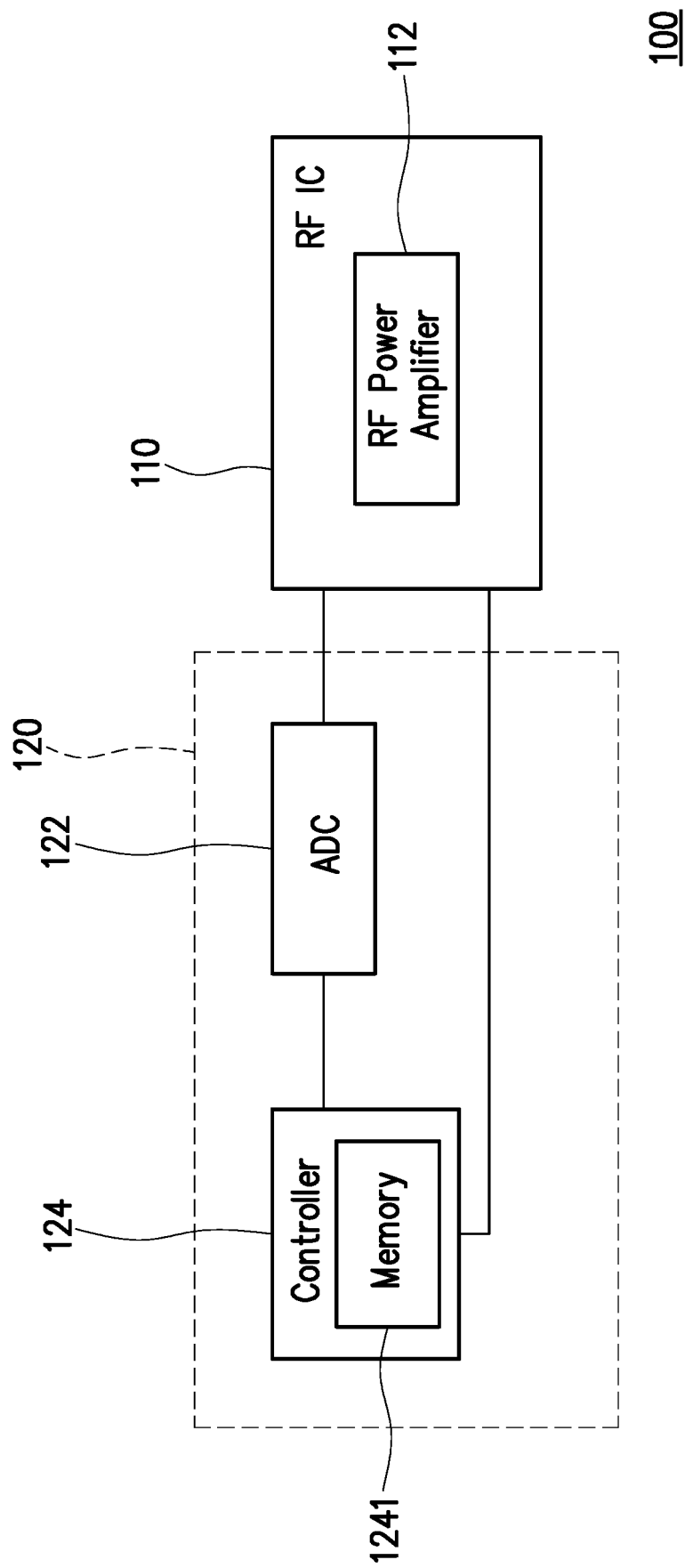
FIG. 1 illustrates a schematic diagram of a measurement system in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a schematic diagram of a measurement system 100 that includes a radio frequency (RF) integrated circuit (IC) 110 and a measurement circuit 120 in accordance with some embodiments. The RFIC 110 is configured to performs operations that are related to RF signals such as receiving the RF signals, processing the RF signals and outputting the RF signals. The RFIC 110 may be coupled to or included in a RF transceiver (not shown) that is configured to receive the RF signals from other devices (not shown) and transmit RF signals to the other devices. In some embodiments, the RFIC 110 includes a RF power amplifier 112 that is configured to amplify a low-power RF signal (not shown) to generate a higher power signal (not shown). In some embodiments, circuit configuration of the RF power amplifier 112 is configured for a DC measurement that is performed by the measurement circuit 120 during a DC measurement period.

In some embodiments, the measurement circuit 120 is configured to perform the DC measurement during a DC measurement period to measure a DC value of the RF power amplifier 110, thereby accessing performance of the RF power amplifier 110. The DC value of the RF power amplifier 110 may include a resistance value, current-voltage (IV) characteristic curve, a saturation current, a linear current of transistors in the RF power amplifier or any other parameters of the RF power amplifier. In some embodiments, the RF power amplifier 112 is configured for the DC measurement, thereby eliminating a necessity of a DC probe. In some embodiments, the measurement circuit 120 is electrically coupled to a connection node in the RF power amplifier 112 to measure the DC value in the DC measurement period. In some embodiments, the DC measurement period is performed before or after a RF stress period or a RF measurement period, in which the predetermined RF signals are applied to the RF power amplifier 112 during the RF stress period and at least one RF measurement is performed to measure RF values of the RF power amplifier during the RF measurement period. The RF value of the RF power amplifier 110 that is measured during the RF measurement period may include power of input signals and output signal, gain of the RF power amplifier 112, or any other RF parameter of the RF power amplifier 112.

In some embodiments, the measurement circuit 120 includes an analog-to-digital converter (ADC) 122 and a controller 124, in which the ADC 122 is coupled to the RFIC 110 and the controller 124 is coupled to the ADC 122 and the RFIC 110. The ADC is configured to receive an analog signal from the RFIC during a measurement (e.g., DC measurement or RF measurement) and convert the received analog signal to generate a digital signal. The digital signal is outputted to the controller 124 for further processing. The controller 124 may include at least one logic circuit that may receive and process the digital signal outputted by the ADC 122. The controller 124 may further control measurements that are performed to the RF power amplifier 112. In some embodiments, the controller 124 may control circuits to supply bias voltages and input signals to the RFIC 110 during the DC measurement period, RF measurement period or RF stress period. For example, controller 124 may control a voltage generator (not shown) to supply bias voltages to the RF power amplifier 112 of the RFIC 110 during DC measurement period, RF measurement period and RF stress period. The structure and architecture of the ADC 122 and the controller 124 of the measurement circuit 120 are not limited to any particular structure or architecture; and the measurement circuit 120 may include other circuits such as a voltage generator, and interface circuit, a memory, and other circuits.

In some embodiments, the controller 124 includes a memory 1241 that is configured to store a plurality of instructions that are executable by the controller 124. The controller 124 may includes at least one processor (not shown) that is configured to execute the plurality of the instructions stored in the memory 1241.

Figures 2A, 2B:
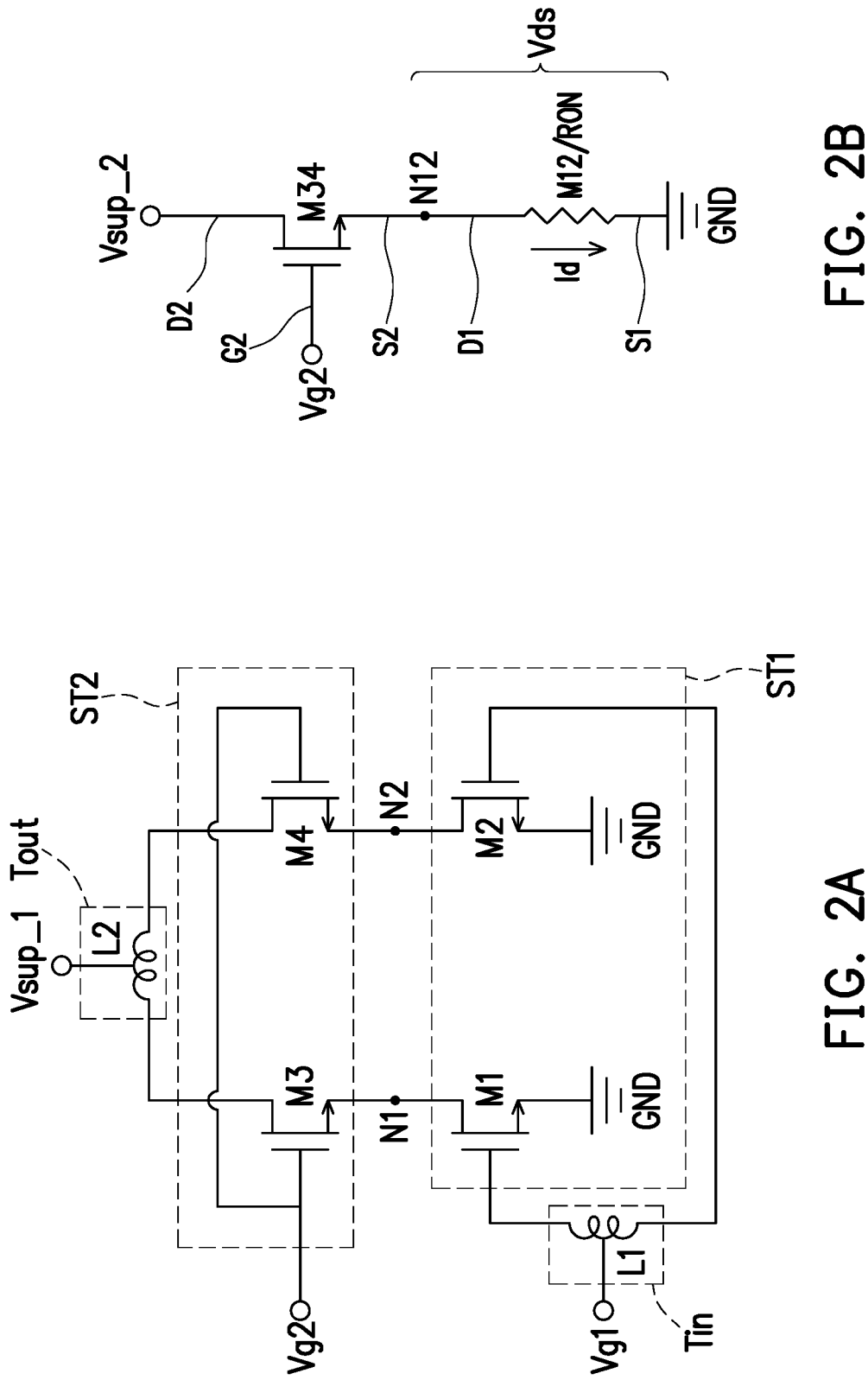
FIG. 2A illustrates a schematic diagram of a radio frequency (RF) power amplifier in accordance with some embodiments.
FIG. 2B through 2D illustrate circuit configurations of a RF power amplifier for DC measurements in accordance with some embodiments.

FIG. 2A illustrates a schematic diagram of the RF power amplifier 112 shown in FIG. 1 in accordance with some embodiments. The RF power amplifier 112 may include a common-source (CS) stage ST1 and a common-gate (CG) stage ST2 that is coupled in series to the CS stage ST1 via connection nodes N1 and N2. The CS stage ST1 includes CS transistors M1 and M2, in which the source terminals of the CS transistors M1 and M2 are electrically coupled to each other. The source terminals of the CS transistors M1 and M2 may be coupled to the ground terminal GND in some embodiments. The drain terminals of the CS transistors M1 and M2 is electrically connected to the connection node N1 and N2, respectively; and the gate terminals of the CS transistors M1 and M2 are coupled to receive a gate bias voltage Vg1.

The CG stage ST2 may include CG transistors M3 and M4, in which the gate terminals of the CG transistors M3 and M4 are electrically connected to each other to receive a gate bias voltage Vg2. The source terminals of the CG transistors M3 and M4 are coupled to the connection nodes N1 and N2, respectively. In other words, the source terminal of the CG transistor M3 is coupled to the drain terminal of the CS transistor M1 through the connection node N1; and the source terminal of the CG transistor M4 is coupled to the drain terminal of the CS transistor M3 through the connection node N2. The drain terminals of the CG transistors M3 and M4 are configured to receive a drain bias voltage Vsup_1.

In some embodiments, the RF power amplifier 112 further includes an input transformer Tin and an output transformer Tout. The input transformer Tin may include a primary coil (not shown) and a secondary coil L1 and is configured to receive a RF input signal (not shown). The output transformer Tout may include a primary coil L2 and a secondary coil (not shown) and is configured to output a RF output signal which is the amplified signal of the RF input signal. In some embodiments, the power amplification functionality of the RF power amplifier 112 are obtained by the CS transistors M1, M2, the CG transistors M3, M4, the input transformer Tin and the output transformer Tout. In some embodiments, the RF input signal is inputted to the gate terminals of the CS transistors M1 and M2 of the CS stage ST1 through the input transformer Tin. The RF input signal is amplified through the CS stage ST1 and the CG stage ST2, and the amplified signal is outputted from drain terminals of CG transistors M3 and M4 of the CG stage ST2. The amplified signal is outputted through the output transformer Tout. In this way, the RF power amplifier 112 may amplify the RF input signal which has low power to output the RF output signal that has higher power.

Referring to FIG. 1 and FIG. 2A, in some embodiments, the circuit structure of the RF power amplifier 112 may be used for DC measurement during the DC measurement period to measure a DC value of the RF power amplifier 112. For example, at least one of the connection node N1 or N2 is electrically coupled to the measurement circuit 120, such that the DC value is measured through the connection node N1 or N2 of the RF power amplifier 112. The measurement circuit 120 may electrically coupled to the connection node N1 and/or N2 through conductive cable, but the disclosure is not limited thereto. In some embodiments, the bias voltage Vg1 that is applied to the gate terminals of the CS transistors M1 and M2 is set to a predetermined voltage (e.g., power supply voltage Vdd) during the DC measurement period, such that the CS transistors M1 and M2 operates in a linear operation mode (e.g., linear region of the transistors M1 and M2). When the CS transistors M1 and M2 operates in the linear operation mode, the CS transistors M1 and M2 are equivalent to resistors having resistance values dependent on the value of the bias voltage Vg1. In some embodiments, a resistance value the CS transistors M1 and M2 in the linear operation mode is determined based on equation (1), where RON is the resistance value of the CS transistor M1 or M2 in the linear operation mode, $\mu_n$ is mobility of electric charges, $C_{ox}$ is a width of oxide layer of the CS transistor M1 or M2, Vgs is the gate-source voltage or the gate bias voltage Vg1 in FIG. 2A, and Vth is the threshold voltage of the CS transistor M1 or M2.

$$RON = \frac{1}{\mu_n C_{ox} \frac{W}{L}(V_{gs} - V_{th})} \quad (1)$$

In some embodiments, the measurement circuit 120 is configured to measure the resistance RON of the CS transistor M1 or M2, a current-voltage (IV) characteristic curve of the CG transistor M3 or M4, a saturation current, a linear current flowing through the CG transistor M3 or M4, or any other DC values (e.g., voltages and currents) of the RF power amplifier 112 via the connection node N1 or N2.

FIG. 2B shows a configuration of RF power amplifier 112 for measuring the resistance value RON of a transistor M12 and the IV characteristic curve of a transistor M34 in accordance with some embodiments. Referring to FIG. 2A and FIG. 2B, the transistor M34 may be any one of the CG transistors M3 and M4 in FIG. 2A; a connection node N12 may be any one of the connection nodes N1 and N2 in FIG. 2A; and the transistor M12 may be any one of the CS transistors M1 and M2 in FIG. 2A. The transistor M12 may have a gate terminal that receives the bias voltage Vg1, a source terminal S1 that is coupled to a ground terminal (GND) and a drain terminal D1 that is coupled to the connection node N12. The transistor M34 may have a gate terminal G2 that is configured to receive the bias gate voltage Vg2, a drain terminal D2 that is configured to receive a drain bias voltage Vsup_2 and a source terminal S2 that is electrically coupled to the connection node N12. In other words, the drain terminal D1 of the transistor M12 is electrically coupled to the source terminal S2 of the transistors M34 via the connection node N12.

In some embodiments, the bias voltage Vg1 that is applied to the gate terminal of the transistors M12 is set to the predetermined voltage Vdd, and the transistor M12 is equivalent to a resistor having resistance value of RON. To measure the resistance value RON, the measurement circuit 120 is configured to measure a drain-source voltage Vds between the drain terminal D1 and the source terminal S1 of the transistor M12 and a current Id flowing through the transistor M12 through the connection node N12. Once the drain-source voltage Vds and the current Id are measured, the resistance value is determined based on the drain-source voltage Vds and the current Id $$\left(\text{e.g., } RON = \frac{Vds}{Id}\right).$$

In this way, the resistance value RON of the transistors M12 is obtained during the DC measurement period via the connection node N12.

In some embodiments, the measurement circuit 120 may further measure the IV characteristic curve of the transistor M34 of the RF power amplifier 112 through the node N12. To measure the IV characteristic curve of the transistor M34, the measurement circuit 120 may apply appropriate values of the bias gate voltage Vg2 and the drain bias voltage Vsup_2 to the transistor M34, and measure the current flowing through the transistors M34 via the connection node N12. In some embodiments, the measurement circuit 120 may sweep at least one of the drain bias voltage Vsup_2 or the gate bias voltage Vg2 in a voltage range that has a plurality of step voltages, and measure step currents corresponding to the step voltages in the voltage range via the connection node N12.

In some embodiments, the measurement circuit 120 may sweep both the drain bias voltage Vsup_2 and the gate bias voltage Vg2, and measure the step currents flowing through the transistor M34 via the node N12 to generate the IV characteristic curve of the transistor M34. The drain bias voltage Vsup_2 may be swept in a drain voltage range that has a plurality of step drain bias voltages and gate bias voltage Vg2 may be swept in a gate voltage range that has a plurality of step gate bias voltages. In some embodiments, the step drain bias voltages of the drain voltage range and step gate bias voltages of the gate voltage range are determined such that the IV characteristic curve of the transistor M34 may represent a cutoff region, a linear region and a saturation region of the transistor M34.

In some embodiments, for each of the step gate bias voltages applied to the gate terminal of the transistor M34, the measurement circuit 120 sequentially applies each of the step drain bias voltages to the drain terminal of the transistor M34 and measure a corresponding step current flowing through the transistor M34 via the connection node N12. The IV characteristic curve of the transistor M34 may be generated based on the step drain bias voltages, the step gate bias voltages and the corresponding step currents that are measured via the connection node N12. In other words, IV characteristic curve of the transistor M34 may be determined in the DC measurement period via the connection node N12 of the RF power amplifier 112.

In some embodiments, the value of the drain bias voltage Vsup_2 is set based on the current Id flowing through the transistor M12 and the resistance value RON of the transistor M12. For example, the Vsup_2 may be determined based on equation (2), where Vdd is a predetermined supply voltage, Id is the current flowing through the transistors M12 and RON is the resistance value of the transistors M12 that operates in the linear operation mode.

$$Vsup\_2 = Vdd + Id*RON \quad (2)$$

In some embodiments, after the IV characteristic curve of the transistor M34 is obtained, the measurement circuit 120 may calibrate the drain-source voltage Vds of the transistor M12 to find correct values for a drain-source voltage and gate-source voltage of the transistor M34.

In some embodiment, after the IV characteristic of the transistor M34 is obtained in the DC measurement period, the measurement circuit may switch from the DC measurement to a RF measurement in a RF measurement period or a RF stress in to a RF stress period. During the RF measurement period, at least one RF parameter such as a signal power, a gain, or any other parameter of the RF power amplifier 112 is measured. During the RF stress period, the predetermined bias voltages and RF signals are applied to the RF power amplifier 112. In some embodiments, the measurement circuit 120 may change the gate bias voltage Vg1 that is applied to the gate terminal of the transistor M12 to switch from the DC measurement period to the RF stress period or the RF measurement period. For example, the gate bias voltage Vg1 is applied to the gate of the transistor M12, such that the transistor M12 operates in a saturation operation mode (e.g., saturation region of the transistor M12) during the RF stress period or the RF measurement period. As the switch between the DC measurement and RF measurement or RF stress may be simply performed by switching the bias voltage Vg1 that is applied to the gate terminal of the transistor M12, the measurement is simplified. In addition, the time consuming for switching of DC probes and RF probes in a conventional measurement technique is reduced, and the cost for expensive DC probes and RF probes is reduced.

Figure 2D:
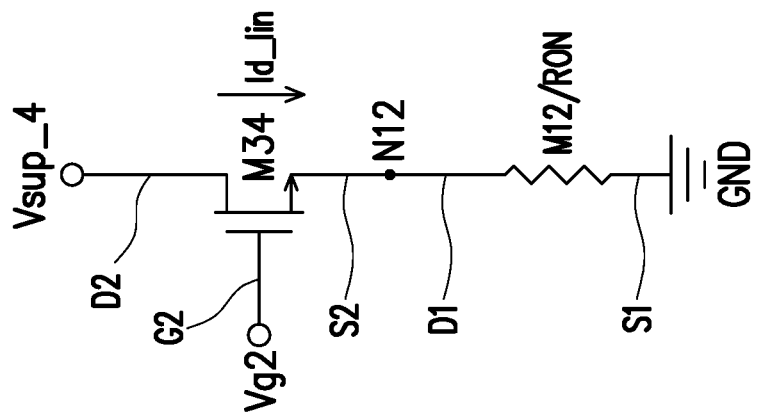
Figure 2C:
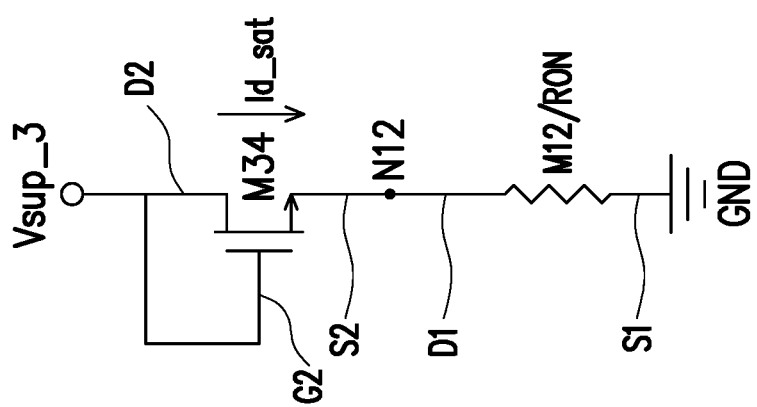

FIG. 2C illustrates a configuration of RF power amplifier 112 for measuring a saturation current Id_sat of the transistor M34 via the connection node N12 during a DC measurement period in accordance with some embodiments. Referring to FIG. 2B and FIG. 2C, the configuration of the RF power amplifier 112 for measuring the IV characteristic curve of the transistor M34 in FIG. 2B is similar to the configuration of the RF power amplifier 112 for measuring the saturation current Id_sat of the transistor M34 in FIG. 2C, except that the drain terminal D2 and the gate terminal G2 are biased by the same bias voltage (e.g., Vg2=Vsup_3) in FIG. 2C. As such, the predetermined voltage Vdd is applied to the gate terminal of the transistor M12, such that the transistor M12 is equivalent to a resistor with a resistance value of RON. As the gate terminal G2 and the drain terminal D2 are applied with the same bias voltage Vsup_3, the drain-source voltage of the transistor M34 is equal to the gate-source voltage of the transistor M34. As a result, the current that is measured from the connection node N12 is saturation current Id_sat. In some embodiments, the value of the bias voltage Vsup_3 depends on the resistance value RON of the transistor M12 and the current Id flowing through the transistors M12. For example, the Vsup_3 may be set to Vsup_3=Vdd+Id*RON, where Vdd is the power supply voltage, Id is the current flowing through the transistor M12 and RON is the resistance value of the transistors M12.

In some embodiments, the measurement circuit 120 may sweep the values of the bias voltage Vsup_3 that is applied to the drain terminal D2 and the gate terminal G2 of the transistor M34 in a voltage range, and measure corresponding step currents flowing through the transistors M34 via the connection node N12. In some embodiments, voltages levels of the step voltages in the voltage range are greater than a voltage value of the drain-source voltage Vds of the transistor M12 to form proper bias voltages to the gate terminal G2 and the drain terminal D2 of the transistor M34. The measurement circuit 120 may sequentially apply each of the step voltages in the voltage range to the transistor M34 and measure the corresponding step currents via the connection node N12. As the gate terminal G2 and the drain terminal D2 are biased by the same bias voltage, the corresponding step currents that are measured from the connection node N12 are saturation currents corresponding to the step voltages. In this way, the measurement circuit 112 may measure the saturation current Id_sat of the transistor M34 via the connection node N12 of the RF power amplifier 112. In other words, the circuit structure of the RF power amplifier 112 may be used during the DC measurement period to measure the saturation currents Id_sat of a transistor in the RF power amplifier 112.

In some embodiments, after the saturation current Id_sat of the transistor M34 is obtained during the DC measurement period, the measurement circuit may switch to the RF stress period or the RF measurement period from the DC measurement period. In some embodiments, the measurement circuit 120 may change the gate bias voltage Vg1 that is applied to the gate of the transistor M12, such that the transistor M12 operates in a saturation operation mode (e.g., saturation region of the transistor M12) during the RF stress period or the RF measurement period. In some embodiments, the performance of the transistor M34 may be evaluated based on the saturation current Id_sat of the transistor M34. For example, when the measured value of the saturation value is smaller than a designed saturation current value, the transistor M34 is degraded.

FIG. 2D illustrates a configuration of RF power amplifier 112 for measuring a linear current Id_lin of the transistor M34 via the connection node N12 during a DC measurement period in accordance with some embodiments. Referring to FIG. 2B and FIG. 2D, the configuration of the RF power amplifier 112 for measuring the IV characteristic curve in FIG. 2B is similar to the configuration of the RF power amplifier 112 for measuring the linear current Id_lin in FIG. 2D, except for a drain bias voltage that is applied to the drain terminal D2 of the transistor M34. In FIG. 2D, the measurement circuit 120 is configured to apply a predetermined drain threshold voltage Vdthx to the drain terminal D2 of the transistor M34. Meanwhile, the measurement circuit 120 may sweep the gate bias voltage Vg2 in a voltage range, and measure a current flowing through the transistor M34 via the node N12 to measure the linear current of the transistor M34. The voltage range may include a plurality of step voltages that are selected such that the transistor M34 operates in the linear operation (e.g., linear region of the transistor M34). For example, the values of the step voltages in the voltage range should be selected such that the gate-source voltage of the transistor M34 is greater than a threshold voltage of the transistor M34 (e.g., Vgs>Vth) and the drain-source voltage of the of the transistor M34 is less than a voltage difference between the gate-source voltage and the threshold voltage (e.g., VDS<(VGS−Vth)). Under the above bias conditions, the transistor M34 operates in the linear operation mode, and the current flowing through the transistor M34 being measured via the connection node N12 is the linear current Id_lin.

In some embodiments, the measurement circuit 120 applies the step voltages in the voltage range to the gate terminal G2 of the transistor M34, and measure currents via the node N12 corresponding to the step voltages. The corresponding currents that are measured from the connection node N12 are the linear current Id_lin of the transistor M34. In this way, the linear current Id_lin of the transistors M34 may be measured via the connection node N12 of the RF power amplifier 112.

In some embodiments, after the linear current Id_lin of the transistor M34 is obtained during the DC measurement period, the measurement circuit 120 may switch to the RF stress period or the RF measurement period from the DC measurement period. In some embodiments, the measurement circuit 120 may change the gate bias voltage Vg1 that is applied to the gate of the transistor M12, such that the transistor M12 operates in a saturation operation mode (e.g., saturation region of the transistor M12) during the RF stress period or the RF measurement period.

Figure 3:
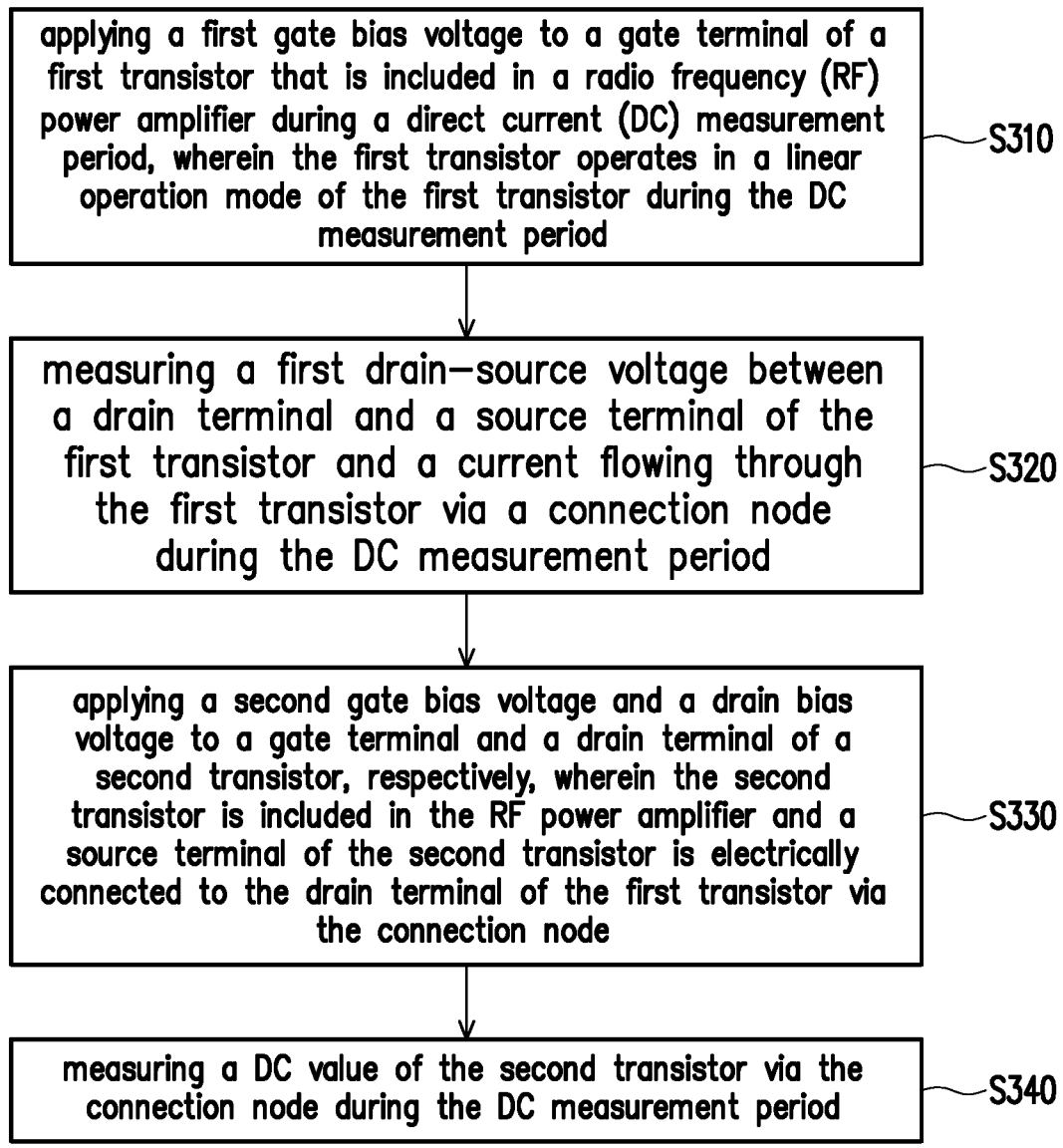
FIGS. 3 through 4 illustrate flowchart diagrams of measurement methods in accordance with some embodiments.

FIG. 3 illustrates a flowchart diagram of a measurement method for measuring a DC value in accordance with some embodiments. In operation S310, a first gate bias voltage is applied to a gate terminal of a first transistor that is included in a radio frequency (RF) power amplifier during a direct current (DC) measurement period, wherein the first transistor operates in a linear operation mode during the DC measurement period. In operation S320, a first drain-source voltage between a drain terminal and a source terminal of the first transistor is measured via a connection node and a current flowing through the first transistor via the connection node during the DC measurement period. In operation S330, a second gate bias voltage and a drain bias voltage is applied to a gate terminal and a drain terminal of a second transistor, respectively, wherein the second transistor is included in the RF power amplifier and a source terminal of the second transistor is electrically connected to the drain terminal of the first transistor via the connection node. In operation S340, a DC value of the second transistor is measured via the connection node during the DC measurement period.

Figure 4:
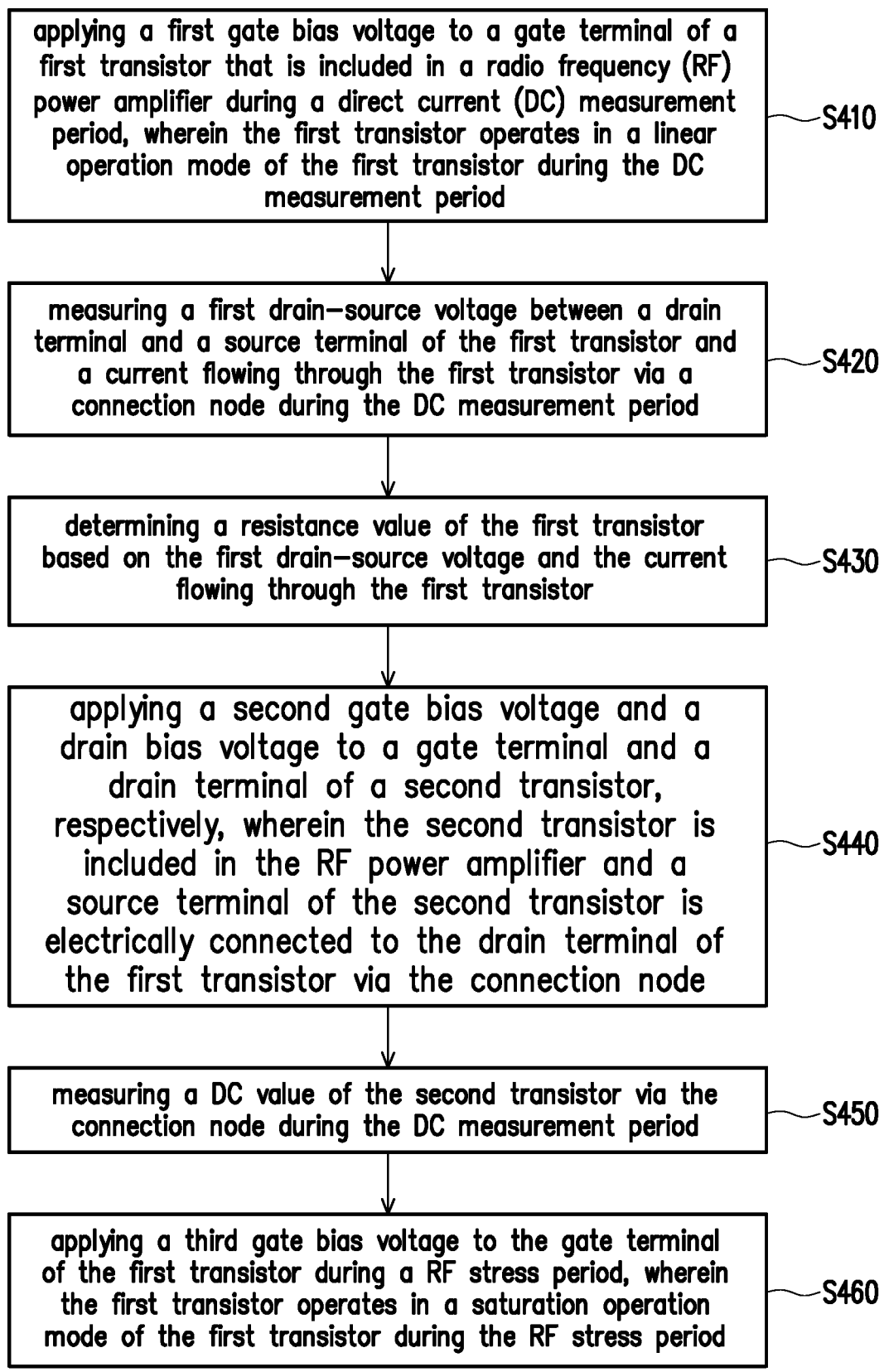

FIG. 4 illustrates a flowchart diagram of a measurement method for measuring a DC value in accordance with some embodiments. In operation S410, a first gate bias voltage is applied to a gate terminal of a first transistor that is included in a radio frequency (RF) power amplifier during a direct current (DC) measurement period, wherein the first transistor operates in a linear operation mode during the DC measurement period. In step S420, a first drain-source voltage between a drain terminal and a source terminal of the first transistor is measured via a connection node and a current flowing through the first transistor is measured via a connection node during the DC measurement period. In operation S430, a resistance value of the first transistor is determined based on the first drain-source voltage and the current flowing through the first transistor. In operation S440, a second gate bias voltage and a drain bias voltage are applied to a gate terminal and a drain terminal of a second transistor, respectively, wherein the second transistor is included in the RF power amplifier and a source terminal of the second transistor is electrically connected to the drain terminal of the first transistor via the connection node. In operation S450, a DC value of the second transistor is measured via the connection node during the DC measurement period. In operation S460, a third gate bias voltage is applied to the gate terminal of the first transistor during a RF stress period, wherein the first transistor operates in a saturation operation mode of the first transistor during the RF stress period.

In accordance with embodiments of the disclosure, a circuit structure of a RF power amplifier is utilized for a DC measurement to measure a DC value via a connection node of the RF power amplifier. The DC value may include at least one of a resistance value of a first transistor included in the RF power amplifier, a IV characteristic curve, a saturation current and a linear current of a second transistor included in the RF power amplifier. In addition, a switch between the DC measurement and an RF measurement or a RF stress may be performed simply by changing a gate bias voltage that is applied to the gate terminal of the first transistor of the RF power amplifier. In this way, time consuming for measurement of the RF power amplifier is significantly reduced. In addition, the necessity for expensive probes may be eliminated, thereby reducing equipment cost for measurements.

In some embodiments, a non-transitory computer-readable medium containing a plurality of instructions, wherein the plurality of instruction, when executed by a processor, cause the processor to perform operations. The operations includes applying a first gate bias voltage to a gate terminal of the first transistor that is included in a radio frequency (RF) power amplifier during a direct current (DC) measurement period, wherein the first transistor operates in a linear operation mode during the DC measurement period; measuring a first drain-source voltage between a drain terminal and a source terminal of the first transistor and a current flowing through the first transistor via a connection node during the DC measurement period; applying a second gate bias voltage and a drain bias voltage to a gate terminal and a drain terminal of a second transistor that is included in the RF power amplifier, respectively; and measuring a DC value of the second transistor via the connection node during the DC measurement period.

In some embodiments, the measurement method includes operations of applying a first gate bias voltage to a gate terminal of a first transistor that is included in a radio frequency (RF) power amplifier during a direct current (DC) measurement period, wherein the first transistor operates in a linear operation mode during the DC measurement period; measuring a first drain-source voltage between a drain terminal and a source terminal of the first transistor and a current flowing through the first transistor via a connection node during the DC measurement period; applying a second gate bias voltage and a drain bias voltage to a gate terminal and a drain terminal of a second transistor, respectively, wherein the second transistor is included in the RF power amplifier and a source terminal of the second transistor is electrically connected to the drain terminal of the first transistor via the connection node; and measuring a DC value of the second transistor via the connection node during the DC measurement period.

In some embodiments, the measurement method includes operations of applying a first gate bias voltage to a gate terminal of a first transistor that is included in a radio frequency (RF) power amplifier during a direct current (DC) measurement period, wherein the first transistor operates in a linear operation mode during the DC measurement period; measuring a first drain-source voltage between a drain terminal and a source terminal of the first transistor and a current flowing through the first transistor via a connection node during the DC measurement period; determining a resistance value of the first transistor based on the first drain-source voltage and the current flowing through the first transistor; applying a second gate bias voltage and a drain bias voltage to a gate terminal and a drain terminal of a second transistor, respectively, wherein the second transistor is included in the RF power amplifier and a source terminal of the second transistor is electrically connected to the drain terminal of the first transistor via the connection node; measuring a DC value of the second transistor via the connection node during the DC measurement period; and applying a third gate bias voltage to the gate terminal of the first transistor during a RF stress period, wherein the first transistor operates in a saturation operation mode of the first transistor during the RF stress period.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A measurement method, comprising:
applying a first gate bias voltage to a gate terminal of a first transistor that is included in a radio frequency (RF) power amplifier during a direct current (DC) measurement period, wherein the first transistor operates in a linear operation mode during the DC measurement period;
measuring a first drain-source voltage between a drain terminal and a source terminal of the first transistor and a current flowing through the first transistor via a connection node during the DC measurement period;
determining a resistance value of the first transistor based on the first drain-source voltage and the current flowing through the first transistor;
applying a second gate bias voltage and a drain bias voltage to a gate terminal and a drain terminal of a second transistor, respectively, wherein the second transistor is included in the RF power amplifier and a source terminal of the second transistor is electrically connected to the drain terminal of the first transistor via the connection node; and
measuring a DC value of the second transistor via the connection node during the DC measurement period, wherein measuring the DC value of the second transistor comprises measuring a current-voltage (IV) characteristic curve of the second transistors, and the drain bias voltage that is applied to the drain terminal of the second transistor depends on the resistance value of the first transistor and the current flowing through the first transistor,
wherein measuring the IV characteristic curve of the second transistor comprises:
sweeping at least one of the second gate bias voltage or the drain bias voltage in a voltage range having a plurality of step voltages;
measuring step currents flowing corresponding to the plurality of step voltages via the connection node; and
generating the IV characteristic curve based on the step currents and the plurality of step voltages.

2. The measurement method of claim 1, wherein the first transistor operates in a saturation operation mode during the RF stress period or the RF measurement period.

3. The measurement method of claim 1, wherein measuring the DC value of the second transistor further comprises measuring a saturation current of the second transistor, and measuring the saturation current of the second transistor comprises:
applying the second gate bias voltage and the drain bias voltage to the gate terminal of the second transistor and the drain terminal of the second transistor, wherein the second bias voltage is same as the drain bias voltage;
sweeping the second bias voltage and the drain bias voltage in a voltage range having a plurality of step voltages;
measuring step currents corresponding the plurality of step voltages via the connection node; and
determining the saturation current according to the step currents that are measured via the connection node.

4. The measurement method of claim 1, wherein measuring the DC value of the second transistor further comprises measuring a linear current of the second transistor, and measuring the linear current of the second transistor comprises:

setting the drain bias voltage to a predetermined voltage and applying the predetermined voltage to the drain terminal of the second transistor;

sweeping the second gate bias voltage in a voltage range having a plurality of step voltages; and measuring step currents corresponding to the plurality of step voltages via the connection node; and determining the linear current according to the step currents that are measured via the connection node.

5. The measurement method of claim 1, wherein the first transistor is one of a plurality of common-source transistors in a common-source stage of the RF power amplifier, the second transistor is one of a plurality of common-gate transistors in a common-gate stage of the RF power amplifier.

6. A measurement method, comprising:

applying a first gate bias voltage to a gate terminal of a first transistor that is included in a radio frequency (RF) power amplifier during a direct current (DC) measurement period, wherein the first transistor operates in a linear operation mode during the DC measurement period;

measuring a first drain-source voltage between a drain terminal and a source terminal of the first transistor and a current flowing through the first transistor via a connection node during the DC measurement period;

determining a resistance value of the first transistor based on the first drain-source voltage and the current flowing through the first transistor;

applying a second gate bias voltage and a drain bias voltage to a gate terminal and a drain terminal of a second transistor, respectively, wherein the second transistor is included in the RF power amplifier and a source terminal of the second transistor is electrically connected to the drain terminal of the first transistor via the connection node; and measuring a DC value of the second transistor via the connection node during the DC measurement period, wherein the first transistor operates in a saturation operation mode during a RF stress period or a RF measurement period, measuring the DC value of the second transistor comprises measuring a current-voltage (IV) characteristic curve of the second transistor, and the drain bias voltage that is applied to the drain terminal of the second transistor depends on the resistance value of the first transistor and the current flowing through the first transistor, wherein measuring the IV characteristic curve of the second comprises:

sweeping at least one of the second gate bias voltage or the drain bias voltage in a voltage range having a plurality of step voltages;

measuring step currents corresponding to the plurality of step voltages via the connection node; and generating the IV characteristic curve based on the step currents and the plurality of step voltages.

7. The measurement method of claim 6, wherein measuring the DC value of the second transistor further comprises measuring a saturation current of the second transistor, and measuring the saturation current of the second transistor comprises:

applying the second bias voltage and the drain bias voltage to the gate terminal of the second transistor and the drain terminal of the second transistor, wherein the second bias voltage is same as the drain bias voltage; and sweeping the second bias voltage and the drain bias voltage in a voltage range having a plurality of step voltages;

measuring step currents corresponding the plurality of step voltages via the connection node; and determining the saturation current according to the step currents that are measured via the connection node.

8. The measurement method of claim 6, wherein measuring the DC value of the second transistor further comprises measuring a linear current of the second transistor, and measuring the linear current of the second transistor comprises:

setting the drain bias voltage to a predetermined voltage and applying the predetermined voltage to the drain terminal of the second transistor;

sweeping the second gate bias voltage in a voltage range having a plurality of step voltages; and measuring step currents corresponding to the plurality of step voltages via the connection node; and determining the linear current according to the step currents that are measured via the connection node.

* * * * *